United States Patent [19]

Kim et al.

[11] Patent Number: 5,232,876
[45] Date of Patent: Aug. 3, 1993

[54] METHOD FOR MANUFACTURING A SILICON LAYER HAVING INCREASED SURFACE AREA

[75] Inventors: Jae K. Kim, Ichon; Chul G. Ko, Seoul, both of Rep. of Korea

[73] Assignee: Hyundai Electronics Industries, Co., Ltd., Rep. of Korea

[21] Appl. No.: 781,992

[22] Filed: Oct. 23, 1991

[30] Foreign Application Priority Data

Oct. 25, 1990 [KR] Rep. of Korea ............... 90-17094

[51] Int. Cl.⁵ .......................................... H01L 21/469
[52] U.S. Cl. .................................. 437/233; 437/198; 437/199; 437/247; 437/919; 437/50; 148/DIG. 14
[58] Field of Search ............... 437/233, 197, 198, 199, 437/247, 248, 919, 50; 148/DIG. 14

[56] References Cited

U.S. PATENT DOCUMENTS

4,927,783 5/1990 Arai et al. ........................... 437/199

OTHER PUBLICATIONS

Pramanik et al., "VLSI Metallization Using Aluminum and its Alloys", Solid State Technology Mar. 1983, pp. 131–138.
Sankur et al., "Solid Phase epitaxial growth of Si mesar from Al metallization", Appl. Phys. Lett. vol. 22, No. 2, Jan. 1972, pp. 64–66.
McCaldin et al., "Precipitation of Si from the Al Metallization of Integrated Circuits", Appl. Phys. Lett., vol. 20, No. 4, Jan. 1972, pp. 171–172.
Fujishira et al., "Solid Solubility of Si in Al under High Pressure", Japanese Journal of Applied Physics, vol. 15, No. 5, May 1976, pp. 777–783.

*Primary Examiner*—Brian E. Hearn
*Assistant Examiner*—Tuan Nguyen
*Attorney, Agent, or Firm*—Ladas & Parry

[57] ABSTRACT

The invention relates to a process for increasing the surface area of a silicon layer for a charge storage electrode by forming a silicon layer having a highly granulated surface and which comprises depositing an alloy layer comprising an A-material 2X and a B-material 2Y on a first insulating layer 1 which is deposited on a substrate. The depositing of the alloy layer takes place at a predetermined temperature to form a plurality of B-material 2Y precipitations on the insulating layer 1 and an A-material 2X layer on the plurality of B-material 2Y precipitations and on a plurality of first insulating layer surfaces not covered by the plurality of B-material 2Y precipitations. The resulting structure is then cooled, preferably to room temperature. The solubility of the B-material 2Y, which may be considered as the solute, is extremely limited in the A-material 2X, which may be considered as the solvent. The A-material 2X is selectively removed from the plurality of first insulating layer surfaces and from the plurality of B-material 2Y precipitations deposited on the insulating layer 1 to expose the plurality of first insulating layer surfaces and the plurality of B-material 2Y precipitations deposited on the first insulating layer to define a highly granulated surface. A silicon layer 3 for charge storage electrode is deposited on the resulting surface comprising the highly granulated surface thereby forming a highly granulated silicon surface to provide, in use, a conducting layer for charge storage electrode whereby the capacitance of the capacitor for a semiconductor device is increased per unit area.

19 Claims, 2 Drawing Sheets

METHOD FOR MANUFACTURING A SILICON LAYER HAVING INCREASED SURFACE AREA

BACKGROUND OF INVENTION

Field of the Invention

The invention elates to a method for manufacturing a silicon layer having an increased surface area, and more particularly, to a method for manufacturing a silicon layer for a charge storage electrode having increased surface area by providing a highly granulated surface area which provides a greater surface area relative to the surface area of the prior art silicon layer where both layers have the same dimensions in length and width.
Related Application:

This application relates to Korean Patent Application No. 90-9260, filed Jun. 22, 1990, and entitled: "A Silicon Layer Having Increased Surface Area and Method for Manufacturing" by In Sool Chung and Jae Kap Kim of which U.S. patent application No. 07/716,901, filed Jun. 18, 1991 is a related application, and expressly incorporated herein by reference.

INFORMATION DISCLOSURE STATEMENT

Generally, as the integrity of the semiconductor memory device increases, the unit area required for constituting the unit memory cell decreases. Therefore upon further increasing the integrity of the semiconductor memory device, the surface area of the charge storage electrode of the semiconductor memory device should be increased within the unit area in order to enhance the capacity of the device. To this end, many kinds of trench capacitors or stacked capacitors had been developed which are constructed with multiple layers to increase the capacitance of the capacitor for semiconductor device. However, there are limits to obtain a highly integrated memory device in a limited unit cell area.

Therefore, it is an object of the present invention to solve the problems set forth above and to provide a method for forming a silicon layer for charge storage electrode including an increased surface area by forming the surface of the silicon layer into a highly granulated topography, which is used as a charge storage electrode of the semiconductor device, to enable the capacitance of the semiconductor device to be increased relative to a prior art semiconductor device.

According to the present invention, the principle of the invention utilizes an A-B binary alloy layer consisting of A- and B-material in which the solubility of B-material is extremely limited in the A-material or an A-B-C ternary alloy layer consisting of A-, B- and C-materials in which the solubility of the C-material is extremely limited in the A- and B-materials in order to obtain a silicon layer having an increased surface area. In using the A-B binary alloy layer, for example, the Al-Si (aluminum-silicon) alloy layer is deposited on the insulating layer at a predetermined temperature and lowering the temperature to room temperature, the Si-material is precipitated from the Al-Si alloy layer and remains on the insulating layer. The Al-material then etched away from the resulting structure utilizing an etchant such as phosphoric acid $H_3PO_4$, with a predetermined etch selectivity for which the etch selectivity of the Al-material is higher than that of the Si-material. After etching, only the Si-material remains on the insulating layer together with a plurality of exposed first insulating layer surfaces so that the surface of the resulting structure is highly granulated. Therefore, if a silicon layer for charge storage electrode is deposited on the highly granulated surface of the insulating layer as mentioned above, he resulting silicon layer has an increased surface area.

Furthermore, the A-B-C ternary alloy, for example an Al-Cu-Si alloy, in which the solubility of Si is extremely limited and is deposited on the insulating layer at a predetermined temperature and is lowered to room temperature. This causes the Si-material to be precipitated from the Al-Cu-Si alloy layer and remains on the insulating layer. The Al-Cu materials are etched from the resulting structure utilizing an etchant with a predetermined etch selectivity for the Al-Cu materials being higher than that of the Si-material. After etching only the Si-material of Al-Cu-Si alloy layer remains so that the surface of the resulting substrate is highly granulated. As a result, upon depositing a silicon layer for charge storage electrode on to the highly granulated surface of the resulting structure, the resulting silicon layer also has an increased surface area. It is noted that the Al-Cu-Si alloy layer used in the invention includes a copper content of 0.5% by weight of the Al-content and a Si-content of 1% by weight of the Al-content. The predetermined temperature mentioned above is about 450 degrees Celsius and phosphoric acid $H_3PO_4$ is used as an etchant for selectively etching the Al-Cu materials.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

The method for manufacturing a silicon layer having an increased surface area of the present invention is defined by the claims with a specific embodiment shown in the attached drawings. For the purpose of summarizing the invention, the invention relates to a process for increasing the surface area of a silicon layer for a charge storage electrode by forming a silicon layer having a highly granulated surface and which comprises depositing an alloy layer comprising an A-material 2X and a B-material 2Y on a first insulating layer 1 which is deposited on a substrate. The depositing of the alloy layer takes place at a predetermined temperature to form a plurality of B-material 2Y precipitations on the insulating layer 1 and an A-material 2X layer on the plurality of B-material 2Y precipitations and on a plurality of first insulating layer surfaces not covered by the plurality of B-material 2Y precipitations. The resulting structure is then cooled, preferably to room temperature. The solubility of the B-material 2Y, which may be considered as the solute, is extremely limited in the A-material 2X, which may be considered as the solvent. The A-material 2X is selectively removed from the plurality of first insulating layer surfaces and from the plurality of B-material 2Y precipitations deposited on the insulating layer 1 to expose the plurality of first insulating layer surfaces and the plurality of B-material 2Y precipitations deposited on the first insulating layer to define a highly granulated surface. A silicon layer 3 for charge storage electrode is deposited o the resulting surface comprising the highly granulated surface thereby forming a highly granulated silicon surface to provide, in use, a conducting layer for charge storage electrode whereby the capacitance of the capacitor for a semiconductor device is increased per unit area.

The alloy layer 2 may comprise an A-B binary alloy layer. Preferably, aluminum is used as the A-material 2X and silicon is used as the B-material 2Y in the A-B binary alloy layer. The depositing of this (Al-Si) layer on to the insulating layer takes place at a temperature of 200–550 degrees Celsius and results in the formation of a plurality of B-material 2Y precipitations on the insulating layer 1. The resulting structure is then cooled which further sets the plurality of B-material 2Y precipitations on the insulating layer. The A-B alloy layer with 0.5% Si by weight dissolved in the Al is the preferred layer and which is (0.5% Si) the maximum amount of Si present in Al at 400 degrees C. Preferably, the aluminum contains 1–30 percent by weight of silicon.

The alloy layer includes ternary alloy layers. The preferred ternary alloy layer is an Al-Cu-Si layer wherein the A-material 2X is an aluminum-copper alloy and the B-material 2Y is silicon. In this case, the solubility of Si (solute) is extremely limited in the Al-Cu (solvent). Preferably, the Al-Cu-Si layer is deposited at a temperature of about 450 degrees Celsius.

The A-material 2X is removed from the B-material 2Y of the alloy layer 2 and the insulating layer by the use of an etchant which has an etch selectivity which is higher for the A-material 2X than that of the B-material 2Y. The preferred etchant where the alloy layer 2 is the Al-Si alloy layer or the Al-Cu-Si layer is phosphoric acid, $H_3PO_4$ to selectively remove the Al-material while maintaining Si-material on the insulating layer 1.

In a further embodiment of the present invention the process for increasing the surface area of a silicon layer for a charge storage electrode by forming a silicon layer having a highly granulated silicon surface comprises depositing an alloy layer 2 comprising an A-material 2X and a B-material 2Y on a first insulating layer 1 deposited on a substrate at a predetermined temperature and cooling the heated alloy layer 2 to a predetermined temperature to form a plurality of B-material 2Y precipitations on the insulating layer 1 and an A-material 2X layer on the plurality of B-material 2Y precipitations and on a plurality of first insulating layer surfaces 1 not covered by the plurality of B-material 2Y precipitations. The A-material 2X is selectively removed from the plurality of first insulating layer surfaces 1 and the plurality of B-material 2Y precipitations deposited on the insulating layer 1 to expose the plurality of first insulating layer surfaces and the plurality of B-material 2Y precipitations deposited on the first insulating layer to define a highly granulated surface. A second insulating layer 4 is deposited to a predetermined thickness on the highly granulated surface formed on the insulating layer 1 to form a highly granulated second insulating layer 4X. A silicon layer is deposited to a predetermined thickness on the highly granulated second insulating layer 4X to prevent the silicon layer 5 from being connected with the plurality of portions of the B-material 2Y and to form a highly granulated silicon surface on the second insulating layer 4.

Preferably, the A-material 2X of the alloy layer is aluminum and the B-material 2Y of the alloy layer is silicon. The solubility of Si relative to Al is 0.5%. The Aluminum may contain about 1–30 percent silicon by weight.

Where the alloy layer is a ternary alloy layer, preferably, the A-material 2X is Aluminum-Copper alloy and the B-material 2Y is silicon. In this case the solubility of Si is extremely limited relative to Al-Cu.

In a further embodiment of the present invention the process for increasing the surface area of a silicon layer for a charge storage electrode by forming a silicon layer having a highly granulated silicon surface comprises depositing an alloy layer 2 comprising an A-material 2X and a B-material 2Y on a first insulating layer 1 deposited on a substrate at a predetermined temperature and cooling to a predetermined temperature to form a plurality of B-material 2Y precipitations on the insulating layer 1 and an A-material 2X layer on the plurality of B-material 2Y precipitations and on a plurality of first insulating layer surfaces 1 not covered by the plurality of B-material 2Y precipitations. The A-material 2X is selectively removed from the plurality of first insulating layer surfaces 1 and from the plurality of B-material 2Y precipitations deposited on the insulating layer 1 to expose the plurality of portions of the first insulating layer and the plurality of B-material 2Y precipitations deposited on the first insulating layer. A plurality of cavities is formed into each of the exposed plurality of first insulating layer surfaces. The plurality of cavities is formed sputter-etching or other means known in the art to etch the into the exposed plurality of first insulating layer surfaces. The B-material 2Y is removed from the surface of the insulating layer 7 by anisotropic etching with $Cl_2$ or $SF_6$, for example, to define a highly granulated surface comprising the plurality of cavities formed into the first insulating layer. A silicon layer 6 is deposited on the entire surface of the resulting surface comprising the plurality of cavities into the insulating layer thereby forming a highly granulated silicon surface layer 6X for use as a charge storage electrode of the semiconductor device such that the capacity of the device can be improved.

In this embodiment the preferred A-material 2X of the alloy layer is aluminum and the preferred B-material 2Y of the alloy layer is silicon. The solubility of Si relative to Al is 0.5% by weight. The aluminum contains about 1–30 percent silicon.

Where the alloy layer is a ternary alloy layer, preferably, the A-material 2X is Aluminum-Copper alloy and the B-material 2Y is silicon. In this case the solubility of Si is extremely limited relative to Al-Cu.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts throughout the several views of the drawings.

DETAILED DESCRIPTION OF THE INVENTION

FIGS. 1A through 1D represent process steps for manufacturing a silicon layer for charge storage electrode including an increased surface area by forming the surface of the silicon layer into a highly granulated topography.

Figure 1A:
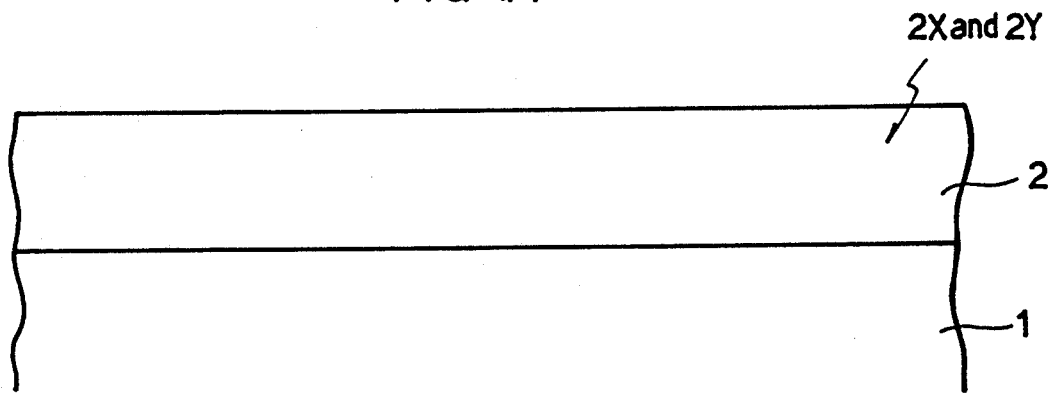
FIGS. 1A through 1D are process steps for forming a silicon layer having an increased surface area according to the first embodiment of the present invention.

Referring to FIG. 1A, an A-B binary alloy layer 2 consisting of A-material 2X and B-material 2Y is deposited on a first insulating layer 1, where the solubility of B-material 2Y is extremely limited in the A-material 2X. It is noted that when Aluminum is used as the A-material 2X and silicon is used as the B-material 2Y, where the solubility of Si relative to Al is 0.5% by weight at a temperature of 400 degree Celsius, 1–30 percent of Si-content by weight is added to Al-content.

Figure 1B:
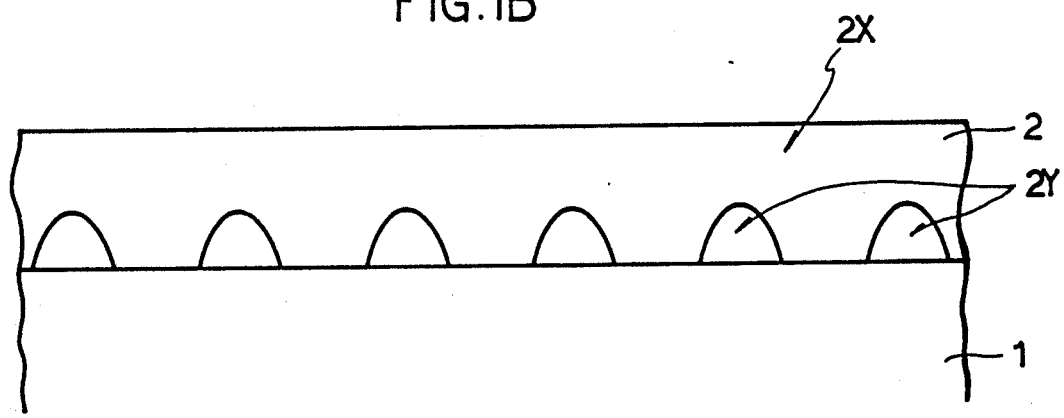

Referring to FIG. 1B, the A-B binary alloy layer 2 is heated at a predetermined temperature, so that B-material 2Y is precipitated as drops or globules on the surface of the insulating layer 1 and in the A-material 2X, whereby the A-B binary alloy layer 2 is divided into A-material 2X and B-material 2Y. It is noted that the heat treatment mentioned above is performed during the process of depositing the A-B binary alloy layer 2 and if the A-B binary alloy layer 2 used is either the Al-Si alloy layer or the Al-Cu-Si layer, the heat treatment of the layer is performed under the temperature of 200–550 degree Celsius.

Figure 1C:
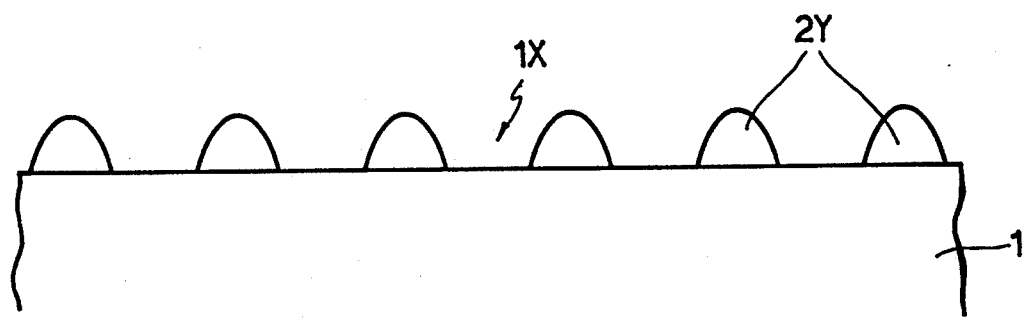

FIG. 1C represents that the result of the use of an etchant on the structure represented in FIG. 1B. In order to selectively remove A-material 2X, which is divided from B-material of the A-B binary alloy layer 2, a etchant having a predetermined etch selectivity for the A-material 2X is higher than that of the B-material 2Y. Thus, the etchant selectively removes the A-material 2X from the plurality of first insulating layer surfaces 1 and from the plurality of B-material 2Y precipitations deposited on the insulating layer 1. After etching the plurality of surfaces of the first insulating layer and the plurality of B-material 2Y precipitations deposited on the first insulating layer are exposed to define a highly granulated surface on the first insulating layer.

Therefore, the surface 1X of the resulting insulating layer 1 is highly granulated. For the Al-Si alloy layer or the Al-Cu-Si layer, the Al-material is preferably removed by utilizing the etchant of the formula $H_3PO_4$ (phosphoric acid), to retain the Si-material on the insulating layer 1.

Figure 1D:
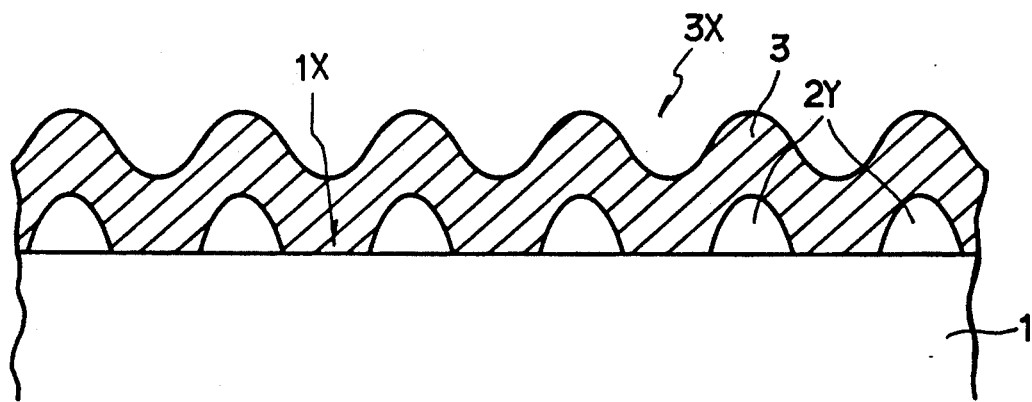

Referring to FIG. 1D, a silicon layer 3 for charge storage electrode is deposited on the resulting highly granulated surface 1X of the insulating layer 1, which includes the B-material 2Y. The resulting surface 3X of the silicon layer 3 deposited on the surface 1X is also highly granulated, so that the resulting silicon layer has an increased surface area. If the silicon layer 3 having the increased surface area as mentioned above is used as a conducting layer for charge storage electrode, the capacitance of the capacitor for semiconductor device can be increased within the unit area.

Figure 2:
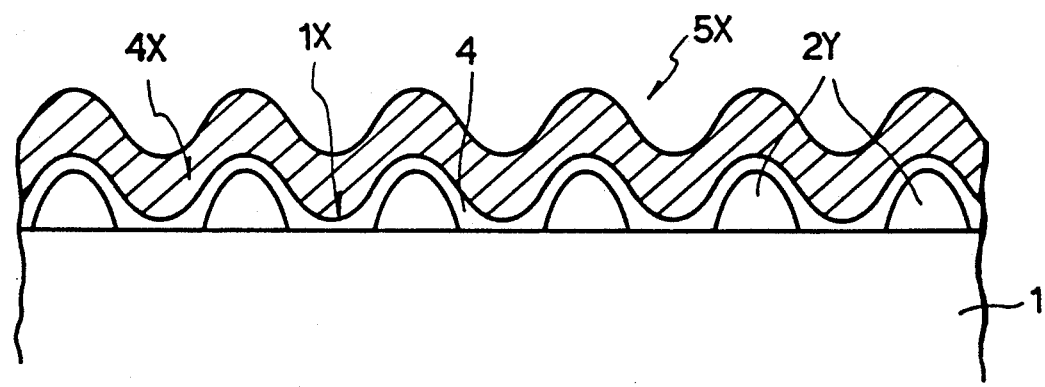
FIG. 2 illustrates a sectional view of a silicon layer having an increased surface area according to the second embodiment of the present invention.

FIG. 2 illustrates a silicon layer having an increased surface area according to the second embodiment of the present invention. In this example, the second insulating layer 4 is deposited to a predetermined thickness on the granulated surface 1X which is formed as described above and illustrated in FIGS. 1A through 1C to form a highly granulated second insulating layer 4X on the highly granulated surface 1X. A silicon layer 5 is then deposited to a predetermined thickness on the second insulating layer 4, which prevents the silicon layer 5 from being connected to any of the portions of the remaining B-material 2Y, to simultaneously form the surface 5X of the silicon layer into a highly granulated topography.

Figure 3:
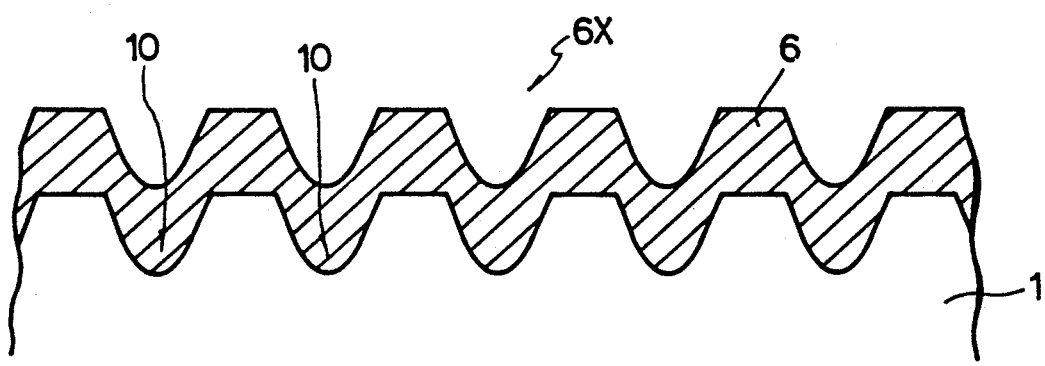
FIG. 3 illustrates a sectional view of a silicon layer having an increased surface area according to the third embodiment of the present invention.

FIG. 3 illustrates a silicon layer having an increased surface area according to the third embodiment of the present invention. In connection with the present of FIGS. 1A through FIG. 1C, a plurality of cavities 10 are formed in the exposed portion of the insulating layer 1 and the remaining B-material 2Y is then removed. The resulting structure comprises the insulating layer with a plurality of cavities formed therein. A silicon layer 6 is then deposited on the entire surface including the plurality of cavities 10 and the insulating layer 1, so that the silicon layer having a highly granulated surface area is obtained.

As described above, according to the present invention, when the silicon layer having an increased surface area by providing a highly granulated surface is used as a charge storage electrode of the semiconductor device, the capacity of the device can be improved so that the integrity of the device is increased.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A method for manufacturing a silicon layer having an increased surface area, the method comprising:

providing a first insulating layer 1 deposited on a substrate;

depositing an alloy layer 2 comprising two materials 2X, 2Y on the first insulating layer 1;

heating the alloy layer 2 to enable one material 2X to be melted and to enable the other material 2Y not to be melted, thereby dividing one material 2X form the other material 2Y of the alloy layer 2 to partitively form the other material 2Y on the first insulating layer 1;

removing the one material 2X partitively formed from the other material 2Y of the alloy layer 2 to expose a portion of the first insulating layer 1, thereby remaining the other material 2Y on the first insulating layer 1 and simultaneously providing a highly granulated surface 1X; and, depositing a silicon layer 3 on the entire surface of the resulting structure to form a granulated silicon layer having an increased surface area.

2. The method of claim 1, wherein the alloy layer is Al-Si binary alloy layer such that one material 2X of the alloy layer is Aluminum and the other material 2Y thereof is silicon the content rate of which is 1–30 percentages of Al-content.

3. The method of claim 1, wherein the material 2X partitively formed from the other material 2Y of the alloy layer is removed by utilizing a predetermined etch selectivity for which the etch selectivity of one material 2X is higher than that of the other material 2Y.

4. The method of claim 1, wherein a second insulating layer 4 is formed between the surface 1X and the silicon layer 3.

5. The method of claim 1, wherein the alloy layer is Al-Cu-Si ternary alloy layer.

6. A process for increasing the surface area of a silicon layer for a charge storage electrode by forming a silicon layer having a highly granulated surface, said process comprising:

depositing an alloy layer 2 comprising an A-material X and a B-material 2X on a first insulating layer 1 deposited on a substrate at a temperature sufficient to enable the A-material 2X to melt thereby dividing the A-material 2X from the B-material 2Y of the alloy layer 2 to partitively form the B-material 2Y on the first insulating layer 1;

cooling the alloy layer 2 to a temperature sufficient to form a plurality of B-material 2Y precipitations on the first insulating layer 1 and an a-material 2X layer on the plurality of B-material 2Y precipitations and on a plurality of first insulating layer surfaces 1 not covered by the plurality of B-material 2Y;

selectively removing the A-material 2X from the plurality of first insulating layer surfaces 1 and from the plurality of B-material 2Y precipitations deposited on the first insulating layer 1 to expose the plurality of surfaces of the first insulating layer and the plurality of B-material 2Y precipitations deposited on the first insulating layer 1 to define a highly granulated surface; and depositing a silicon layer 3 for charge storage electrode on the resulting surface comprising the highly granulated surface thereby forming a highly granulated silicon surface to provide, in use, a conducting layer for charge storage electrode whereby the capacitance of the capacitor for a semiconductor device is increased per unit area.

7. The process of claim 6 wherein the alloy layer 2 is cooled to room temperature.

8. The process of claim 6 wherein the solubility of the B-material 2Y is extremely limited in the A-material 2X.

9. The process of claim 8 wherein aluminum is used as the A-material 2X and silicon is used as the B-material 2Y.

10. The process of claim 9 wherein the aluminum contains 1–30 percent silicon by weight.

11. The process of claim 6 wherein the A-material 2X is an aluminum-copper alloy and the B-material 2Y is silicon.

12. The process of claim 11 wherein the Al-Cu-Si layer is deposited at a temperature of about 450 degrees Celsius.

13. The process of claim 6 wherein the alloy layer 2 is an A-B binary alloy layer 2 consisting of an Al-Si binary alloy layer which is heated to a temperature of 200–550 degree Celsius during the depositing of the A-B binary alloy layer 2 and then cooled to room temperature to make the plurality of B-material 2Y precipitations on the insulating layer 1.

14. The process of claim 6 wherein the A-material 2X is removed from the B-material 2Y of the alloy layer 2 and from the insulating layer by utilizing an etchant with a predetermined etch selectivity for the A-material 2X being higher than the etch selectivity of the B-material 2Y.

15. The process of claim 14 wherein the etchant is phosphoric acid, $H_3PO_4$ and the alloy layer 2 is selected from the group consisting of an Al-Si alloy layer or an Al-Cu-Si alloy layer.

16. A process for increasing the surface area of a silicon layer for a charge storage electrode by forming a silicon layer having a highly granulated surface, said process comprising:

depositing an alloy layer 2, comprising an A-material 2X and a B-material 2Y, with the B-material 2Y having an extremely limited solubility in the A-material 2X, at a temperature of 200–550 degrees Celsius on a first insulating layer 1 which is deposited on a substrate and cooling the heated alloy layer 2 to form a plurality of B-material 2Y precipitations on the insulating layer 1 and an A-material 2X layer on the plurality of B-material 2Y precipitations and on a plurality of first insulating layer surfaces 1 not covered by the plurality of B-material 2Y precipitations;

selectively removing the A-material 2X from the plurality of first insulating layer surfaces 1 and from the plurality of B-material 2Y precipitations deposited on the insulating layer to expose the plurality of first insulating layer surfaces and the plurality of B-material 2Y precipitations deposited on the first insulating layer by selectively etching the A-material 2X with phosphoric acid to define a highly granulated surface; and depositing a silicon layer 3 for charge storage electrode on the resulting surface comprising the highly granulated surface thereby forming a highly granulated silicon surface to provide, in use, a conducting layer for charge storage electrode whereby the capacitance of the capacitor for a semiconductor device is increased per unit area.

17. The process of claim 16 wherein the A-material 2X of the alloy layer is aluminum and the B-material 2Y of the alloy layer is silicon with the Aluminum containing about 1–30 percent silicon by weight.

18. The process of claim 17 wherein the alloy layer is heated at a temperature of 400 degree Celsius and then cooled to room temperature.

19. The process of claim 16 wherein the A-material 2X is Aluminum-Copper alloy and the B-material 2Y is silicon and where the solubility of Si is extremely limited in the Al-Cu alloy.

* * * * *